(12) United States Patent
Manninen et al.

(10) Patent No.: US 11,764,125 B2
(45) Date of Patent: Sep. 19, 2023

(54) HEATSINK ASSEMBLY, METHOD OF MANUFACTURING A HEATSINK ASSEMBLY, AND AN ELECTRICAL DEVICE

(71) Applicant: ABB Schweiz AG, Baden (CH)

(72) Inventors: Jorma Manninen, Helsinki (FI); Mika Silvennoinen, Helsinki (FI); Joni Pakarinen, Helsinki (FI)

(73) Assignee: ABB Schweiz AG, Baden (CH)

( * ) Notice: Subject to any disclaimer, the term of this patent is extended or adjusted under 35 U.S.C. 154(b) by 333 days.

(21) Appl. No.: 16/847,850

(22) Filed: Apr. 14, 2020

(65) Prior Publication Data
US 2020/0335417 A1 Oct. 22, 2020

(30) Foreign Application Priority Data
Apr. 16, 2019 (EP) ..................................... 19169398

(51) Int. Cl.
| | | |
|---|---|---|
| *H01L 23/373* | (2006.01) | |
| *F28F 21/02* | (2006.01) | |
| *F28F 21/08* | (2006.01) | |
| *H01L 21/48* | (2006.01) | |

(Continued)

(52) U.S. Cl.
CPC .......... *H01L 23/3735* (2013.01); *F28F 21/02* (2013.01); *F28F 21/089* (2013.01); *H01L 21/4882* (2013.01); *B32B 27/36* (2013.01); *B32B 37/18* (2013.01)

(58) Field of Classification Search
CPC ............. H01L 23/3735; H01L 21/4882; H01L 23/373; F28F 21/02; F28F 21/089; H05K 7/2039; B32B 37/18; B32B 27/36
See application file for complete search history.

(56) References Cited

U.S. PATENT DOCUMENTS

| | | | |
|---|---|---|---|
| 2004/0177947 A1 | 9/2004 | Krassowski et al. | |
| 2005/0013119 A1* | 1/2005 | Misra ................... | H01L 23/367 257/E23.102 |

(Continued)

FOREIGN PATENT DOCUMENTS

| | | |
|---|---|---|
| CN | 103547441 A | 1/2014 |
| EP | 3514827 A1 | 7/2019 |

(Continued)

OTHER PUBLICATIONS

European Patent Office, Extended Search Report issued in corresponding Application No. 19169398.5, dated Oct. 16, 2019, 9 pp.

(Continued)

*Primary Examiner* — Patricia D Valenzuela
(74) *Attorney, Agent, or Firm* — Leydig, Voit & Mayer, Ltd.

(57) ABSTRACT

A heatsink assembly, a method of producing a heat sink assembly and an electrical device. The heatsink assembly including a heatsink having a surface for receiving a heat source, a copper insert and a layer of low density pyrolytic graphite. The copper insert and the layer of low density pyrolytic graphite are arranged on the surface of the heatsink in layers to form a heat transferring assembly, and the heat transferring assembly is adapted to receive a heat source for transferring the heat from the heat source to the heatsink.

20 Claims, 2 Drawing Sheets

(51) Int. Cl.
   *B32B 27/36* (2006.01)
   *B32B 37/18* (2006.01)

(56) References Cited

U.S. PATENT DOCUMENTS

2007/0062676 A1* 3/2007 Yao .................... H01L 23/3675
                                                            361/705
2012/0234524 A1* 9/2012 Fan ........................ B32B 9/007
                                                            165/185
2019/0381763 A1* 12/2019 Tsuda ...................... B32B 27/36

FOREIGN PATENT DOCUMENTS

| JP | 3122382 U | 6/2006 |
| JP | 2012-238733 A | 12/2012 |
| TW | 200917435 A | 4/2009 |
| WO | 03052340 A1 | 6/2003 |

OTHER PUBLICATIONS

China National Intellectual Property Administration, Office Action in Chinese Patent Application No. 202010295264.X, 18 pp. (dated Sep. 21, 2022).

Keikikaku, "PGS Graphite Sheets," downloaded from the Internet on Feb. 14, 2019, at https://eu.mouser.com/datasheet/2/315/AYA0000CE2-64434.pdf, 10 pp. (Nov. 7, 2015).

European Patent Office, Office Action in European Patent Application No. 19169398.5, 4 pp. (dated Jun. 7, 2022).

\* cited by examiner

HEATSINK ASSEMBLY, METHOD OF MANUFACTURING A HEATSINK ASSEMBLY, AND AN ELECTRICAL DEVICE

CROSS-REFERENCE TO PRIOR APPLICATIONS

This application claims priority to European Patent Application No. 19169398.5, filed on Apr. 16, 2019, the entire disclosure of which is hereby incorporated by reference herein.

FIELD OF THE INVENTION

The invention relates generally to heatsinks, and particularly to heatsinks for use with power electronic modules.

BACKGROUND OF THE INVENTION

It is known that electronic components, such as power semiconductors and power semiconductor modules, require cooling to keep the temperatures of the components within certain limits. The cooling of such components is usually carried out by attaching the components from the cooling surfaces to a surface of a heatsink.

In its simplest for a heatsink consist of a block of metal, such as aluminium, and of cooling fins which are attached to or are integral part of the metal block. The heat generating component is attached firmly to the surface of the heatsink, and heat is transferred from the component to the block and removed to the ambient from the cooling fins.

The heat transfer from the component or module to the heatsink can be increased by using specific structures attached to the heatsink. One known structure for increasing the heat transfer is a heat pipe. In heat pipes the heat transfer is enhanced with the aid of liquid phase change. However, the heat pipes have certain deficiencies relating to the increased production of heat. One of the problems with heat pipes is a phenomenon known as dry-out, in which the increased heat generation does not allow the phase change to be complete and the heat pipe loses its ability to transfer heat. As dry-out is encountered with high temperatures, the sudden losing of heat transfer may lead to abrupt increase of temperature of the cooled component and to destruction of the component.

BRIEF DESCRIPTION OF THE INVENTION

An object of the present invention is to provide a heatsink assembly, a method of producing a heatsink assembly and an electrical device so as to overcome the above problems. The objects of the invention are achieved by an assembly, a method and a device which are characterized by what is stated in the independent claims. The preferred embodiments of the invention are disclosed in the dependent claims.

The invention is based on the idea of providing a heat transferring assembly from a copper insert and a layer of low density pyrolytic graphite. The heat transferring assembly is arranged on the surface of the heatsink and it provides a surface to which the heat generating component is to be attached. Thus the heat transferring assembly is to be placed between the heat generating component and the heatsink to increase the heat transfer from the heat generating component to the heatsink.

The layer of the low density pyrolytic graphite is preferably a compressed layer which consists of one or more sheets of low density pyrolytic graphite. In a compressed layer the one or more sheets are pressed with a high pressure to increase the density of the graphite in the direction of the thickness of the sheets. The compressed layer together with the copper insert has the ability to transfer heat effectively through the assembly. Further, the heat transferring assembly has the ability to spread the heat effectively. The spreading of heat means that the heat is transferred in the planar direction of the layer. When the heat is transferred in the planar direction, a larger surface area is able to transfer heat further to the heatsink. With the spreading of heat the heatsink is utilized more effectively than in known heatsink structures.

BRIEF DESCRIPTION OF THE DRAWINGS

In the following the invention will be described in greater detail by means of preferred embodiments with reference to the accompanying drawings, in which.

DETAILED DESCRIPTION OF THE INVENTION

Figure 1:
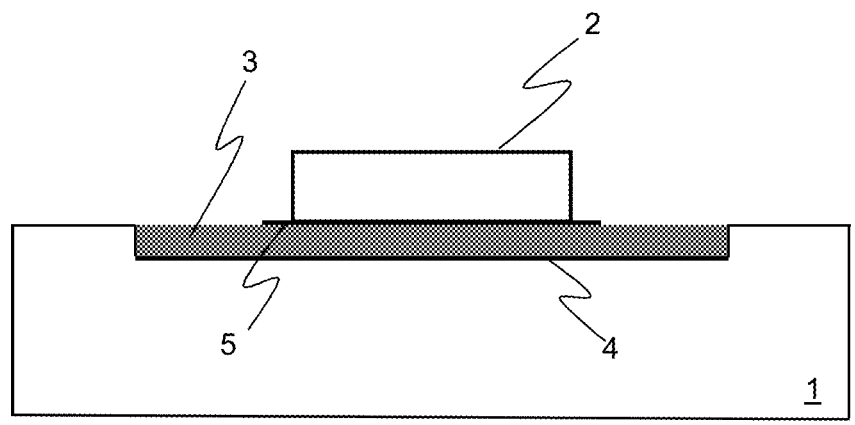
FIG. 1 illustrates a cross section of an embodiment of the invention.

FIG. 1 shows a cross section of an embodiment of the present invention. In FIG. 1, a heat source 2, such as a power electronic module, is shown to be thermally attached to a heat sink 1. A power electronic module is a device which includes multiple of power semiconductor switches. The switches of the module are typically connected inside the module such that the module can be used as a pre-fabricated circuit. Typical implementations of switches include pre-wired bridge circuits or half-bridge circuits. The power electronic modules include also a cooling surface to which the losses of the switch components are lead and which is intended to be thermally connected to appropriately dimensioned heatsink. The width and length of the cooling surface of a power electronic module can be up to tens of centimetres.

The embodiment of FIG. 1 comprises a copper insert 3 and a layer of low density pyrolytic graphite 4, which are arranged on the surface of the heatsink in layers to form a heat transferring assembly. The heat transferring assembly is further adapted to receive a heat source 2 to transfer the heat from the heat source to the heatsink 1.

In the embodiment of FIG. 1, the layer of low density pyrolytic graphite 4 is arranged in to be in contact with the surface of the heatsink 1, and the copper insert 3 is placed on top of the low density pyrolytic graphite layer. The upper surface of the copper insert is the surface to which the heat source can be attached. In the example FIG. 1, the heat source, such as a power electronic module is shown to be attached to the surface of the heat transferring assembly. For maximizing the heat transfer from the heat source, a thermal interface material 5 is employed in the example of FIG. 1 between the cooling plate or base plate of the heat source 2 and the surface of the heatsink assembly of the invention. The employed thermal interface material layer 5 can be any known thermal interface. Such thermal interfaces are used to increase the transfer of heat from the bottom of the component by evening the any irregularities between the mating surfaces.

FIG. 1 shows that the surface of the heatsink has an indent to which heat transferring assembly is attached. The layer of low density pyrolytic graphite is formed preferably from one or more of low density pyrolytic graphite sheets which are compressed using high pressure. As the separate sheets are compressed to form a layer, the ability to transfer heat through the thickness of the layer increases as the layer gets denser.

In the embodiment of FIG. 1, separate sheets of low density pyrolytic graphite are placed in the indent of the heatsink, and pressure is applied to compress the sheets using the copper insert. Thus the copper insert is pushed towards the heatsink with the sheets between the copper insert 3 and the heatsink 1. When the pressure is applied to the copper insert, the insert is fastened to the surface of the heatsink such that the sheets of low density pyrolytic graphite are in compressed state. The copper insert is preferably fastened to the surface of the heatsink by using pressure welding or laser welding. After the copper insert is fastened to the heatsink, the open or upper surface of the copper insert 20 acts as an attachment place for a heat generating component. The density of the low density pyrolytic graphite is preferably in the range of 0.25 $g/cm^3$ to 0.85 $g/cm^3$.

Figure 2:
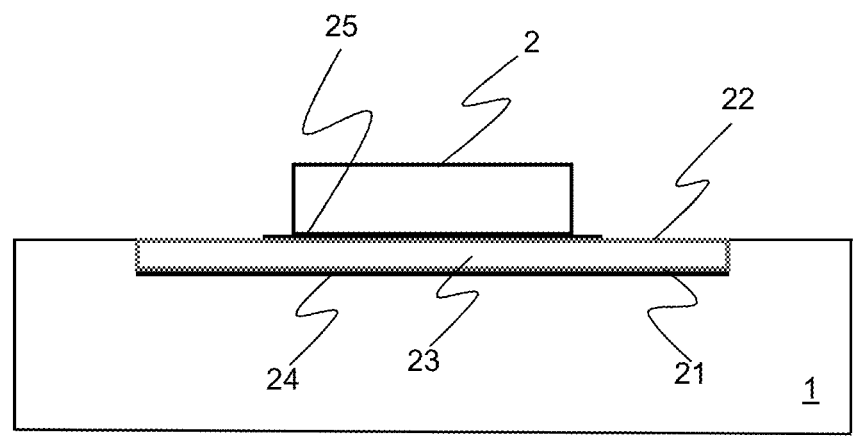
FIG. 2 illustrates a cross section of another embodiment of the invention.

FIG. 2 shows another embodiment of the invention in which the heat transferring assembly differs from the first embodiment. In the embodiment a compressed layer 23 of low density pyrolytic graphite is placed between two copper inserts 21, 22 to form the heat transferring assembly. Thus the heat transferring assembly consists of two copper inserts or copper sheets 21, 22 with a layer 23 of low density pyrolytic graphite between the copper sheets.

For keeping the layer 23 of low density pyrolytic graphite in compressed state, the copper sheets 21, 22 are fastened to each other. In the embodiment of FIG. 2, the copper sheets are used in a box-like structure, in which the copper sheets form the top 22 and the bottom 21 of the box-like structure. In a box-like structure the top 22 and the bottom 21 are connected to each other through the sides of the box-like structure, for example. According to an embodiment, sheets of low density pyrolytic graphite are arranged in a box without the top 22, i.e. including a bottom 21 and sides, the bottom forming one copper sheet or copper insert. When the sheets are placed in the box, a top or a cover of the box is placed on top of the sheets and pressed with the cover such that the sheets are compressed. The cover 22, which forms the other copper sheet or insert, is then attached in place to form a box in which the sheets of low density pyrolytic graphite are in compressed state. The cover to the box is preferably attached by laser welding. In the embodiment, the density of the low density pyrolytic graphite is preferably in the range of 0.25 g/cm3 to 1.8 g/cm3. When the low density pyrolytic graphite sheets are arranged between copper sheets, the density of the layers can be somewhat higher than in connection with the embodiment in which the graphite sheets are placed directly towards the surface of the heatsink. This is because higher pressing forces may be applied in the procedure with the copper sheets than in connection with applying the sheets directly to the surface of the heatsink.

As shown in FIG. 2, the box having copper sheets or inserts as a top and a bottom is arranged in an indent made to the surface of the heatsink 1. The heat generating component such as power electronic module 2 is attached on top of the box, and the box with the compressed low density pyrolytic graphite forms a heat transferring assembly. In FIG. 2 thermal interface material layers 24, 25 are arranged between the heat transferring assembly and the surface of the heatsink and between the heat transferring assembly and the heat generating component, such as a power electronic module.

The surface area of the heat transferring assembly is preferably larger than the surface area of the heat generating component that is to be attached to the heatsink assembly. When the copper insert and the low density pyrolytic graphite layer have a larger surface area, the heat is spread effectively and evenly to the body of the heatsink, which is typically aluminium.

Figure 3:
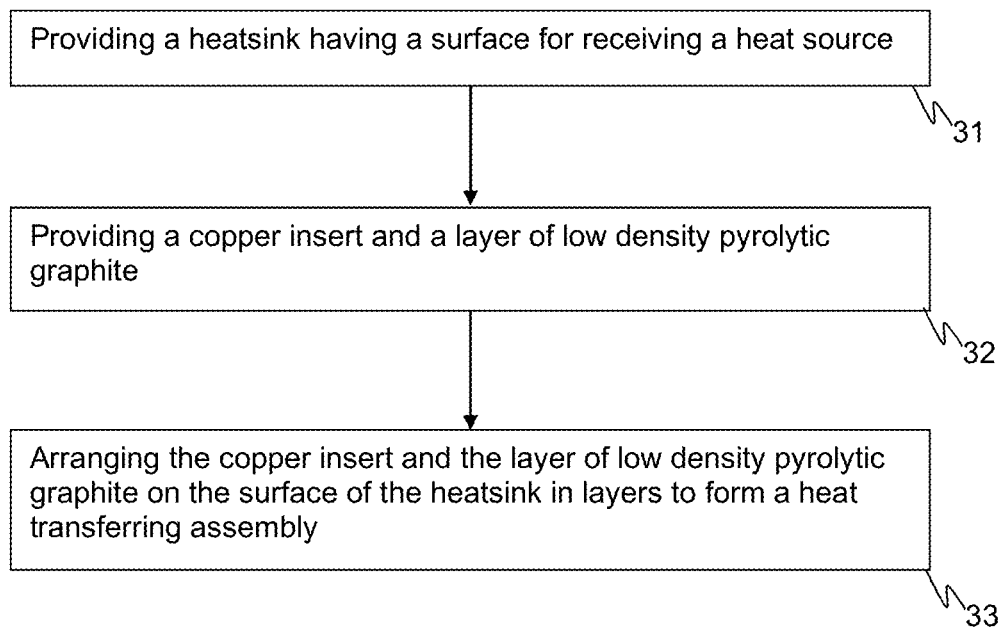
FIG. 3 shows an embodiment of the method of the invention.

With reference to FIG. 3, an embodiment of the method of the invention comprises providing 31 a heatsink having a surface for receiving a heat source, providing 32 a copper insert and a layer of low density pyrolytic graphite, and arranging 33 the copper insert and the layer of low density pyrolytic graphite on the surface of the heatsink in layers to form a heat transferring assembly.

Preferably the method comprises compressing one or multiple of sheets of low density pyrolytic graphite to form a compressed layer of low density pyrolytic graphite to be used in the heat transferring assembly. As the sheet or sheets of low density pyrolytic graphite is compressed, good thermal properties are obtained.

According to an embodiment of the invention an indent is provided to the surface of the heatsink and the one or multiple of sheets are arranged in the intend. The sheets are compressed using the copper insert, and the copper insert is attached to the heatsink.

Preferably the indent and the copper insert are dimensioned such that when compressed, the edges or sides of the copper insert are close to the inner edges of the indent. That is to say that the indent and the copper insert have substantially same shape and size such that the indent can be attached to the heatsink. The attachment of the copper insert is preferably carried out by laser welding.

According to another embodiment two copper plates are provided and one or multiple of sheets of low density pyrolytic graphite is arranged between the two copper inserts. A pressure is applied to compress the one or multiple of sheets of low density pyrolytic graphite between the two copper inserts. As the one or multiple of sheets of low density pyrolytic graphite are in compressed state, the copper inserts are attached to each other. The copper inserts with the sheets in compressed state are further arranged on the surface of the heatsink. The attached copper inserts are arranged to form the place to which heat generating component is to be attached.

According to an embodiment, the copper inserts are in the form of copper sheets which, when attached together, produce a box-like structure. This means that one of the sheets have structures which produce sidewalls for the box-like structure. In the embodiment, sheets of low density pyrolytic graphite are placed on one of the copper sheets and the other one is used for compressing the graphite sheets. While the graphite sheets are in compressed state, the copper sheets with side walls are attached to each other so that a box-like structure is obtained in which the graphite sheets are in compressed state.

The obtained box-like structure is placed on a surface of the heatsink, and preferably to a recess or indent made in the surface of the heatsink. The box-like structure produces a heat transferring assembly, and it is adapted for receiving a heat source such as a power electronic module in thermal connection.

The disclosure relates also to an electronic device comprising at least one heat generating semiconductor component. The heat generating component is preferably a semiconductor component or a power electronic module. The device further comprises a heatsink assembly comprising a heatsink, a copper insert and a layer of low density pyrolytic graphite. In the device, the copper insert and the layer of low density pyrolytic graphite are arranged on the surface of the heatsink in layers to form a heat transferring assembly. Further the at least one heat generating semiconductor component is attached thermally to the heat transferring assembly for transferring the heat from the semiconductor component to the heatsink.

The device of the invention has advantages provided by the heatsink assembly. The assembly enables to produce a reliable electronic device in which the cooling of the semiconductor components is enhanced. Further, as the heatsink assembly utilizes the heatsink in efficient manner, the size of the heatsink and also the electronic device can be reduced. The device may be, for example, an inverter or a frequency converter, in which power electronic modules are employed.

Figure 4:
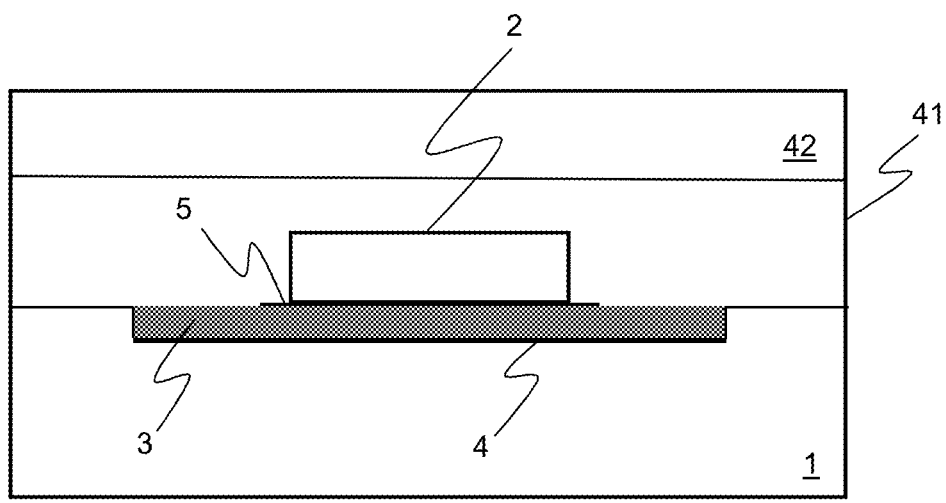
FIG. 4 shows an embodiment of a device of the invention.

FIG. 4 shows cross section of a simplified structure of the device of the disclosure. FIG. 4 utilizes the heatsink assembly of FIG. 1 and the reference numerals relating to FIG. 1 are also used in connection with FIG. 4. The device of FIG. 4 comprises a casing 41 or an outer structure and a heat source, such as a power electronic module, attached to the heatsink assembly for cooling the power electronic module. Further, the inverter has a separate compartment 42 for components which do not produce considerably amount of heat or which do not tolerate the heat produced by heat generating components. FIG. 4 is presented as an example of the device and the heatsink assembly of the invention can be used in different kinds of devices.

The sheets of low density pyrolytic graphite are typically very thin. The amount of sheets and thus the thickness of the layer may vary depending on the design of the heatsink assembly.

It will be obvious to a person skilled in the art that, as the technology advances, the inventive concept can be implemented in various ways. The invention and its embodiments are not limited to the examples described above but may vary within the scope of the claims.

The invention claimed is:

1. A heatsink assembly, comprising:
a heatsink having a surface for receiving a heat source;
a copper insert; and
a layer of low density pyrolytic graphite having a density in a range of 0.25 g/cm$^3$ to 1.8 g/cm$^3$,
wherein the copper insert and the layer of low density pyrolytic graphite are arranged on the surface of the heatsink in layers to form a heat transferring assembly, and
wherein the heat transferring assembly is configured to receive the heat source to transfer heat from the heat source to the heatsink.

2. The heatsink assembly according to claim 1, wherein the layer of low density pyrolytic graphite comprises a compressed layer comprising at least one sheet of low density pyrolytic graphite.

3. The heatsink assembly according to claim 2, wherein the compressed layer of low density pyrolytic graphite is on the surface of the heatsink and the copper insert is attached to the heatsink on top of the said compressed layer and arranged to hold the said layer in compressed state, and a surface of the copper insert is adapted to form the surface of the heat transferring assembly.

4. The heatsink assembly according to claim 3, wherein the surface of the heatsink comprises an indent and the compressed layer of low density pyrolytic graphite is arranged in the indent of the surface of the heatsink and the copper insert attached to the edges of the intend.

5. The heatsink assembly according to claim 1, wherein a thermal interface material layer is arranged on the surface of the heat transferring assembly.

6. The heatsink assembly according to claim 2, wherein the compressed layer of low density pyrolytic graphite is arranged between two copper inserts to form the heat transferring assembly.

7. The heatsink assembly according to claim 6, wherein the two copper inserts are in the form of copper sheets between which the compressed layer of low density pyrolytic graphite is arranged.

8. The heatsink assembly according to claim 7, wherein the two copper sheets are welded together to form a structure in which the layer of low density pyrolytic graphite is held compressed.

9. The heatsink assembly according to claim 7, wherein the copper sheets form a top and a bottom of a box-like structure, and the compressed layer of low density pyrolytic graphite is arranged in the box-like structure.

10. The heatsink assembly according to claim 8, wherein the surface of the heatsink comprises an indent and the two copper sheets with a layer of low density pyrolytic graphite compressed between the sheets is arranged in the indent.

11. The heatsink assembly according to claim 8, wherein a thermal interface material layer is arranged between the heat transferring assembly and the heat sink and on the surface of the heat transferring assembly.

12. The heatsink assembly according to claim 1, wherein a thermal interface material layer is arranged on a surface of the heat transferring assembly.

13. The heatsink assembly according to claim 8, wherein the copper sheets form a top and a bottom of a box-like structure, and the compressed layer of low density pyrolytic graphite is arranged in the box-like structure.

14. The heatsink assembly according to claim 9, wherein the surface of the heatsink comprises an indent and the two copper sheets with a layer of low density pyrolytic graphite compressed between the sheets are arranged in the indent.

15. The heatsink assembly according to claim 9, wherein a thermal interface material layer is arranged between the heat transferring assembly and the heat sink and on a surface of the heat transferring assembly.

16. The heatsink assembly according to claim 2, wherein a thermal interface material layer is arranged on a surface of the heat transferring assembly.

17. A method of producing a heatsink assembly, the method comprising:
providing a heatsink having a surface for receiving a heat source;
providing a copper insert and a layer of low density pyrolytic graphite having a density in a range of 0.25 g/cm$^3$ to 1.8 g/cm$^3$; and
arranging the copper insert and the layer of low density pyrolytic graphite on the surface of the heatsink in layers to form a heat transferring assembly.

18. The method according to claim 17, wherein the method comprises further compressing one or multiple of sheets of low density pyrolytic graphite to form a compressed layer of low density pyrolytic graphite to be used in the heat transferring assembly.

19. The method according to claim 18, wherein the method comprises:
providing an indent to the surface of the heatsink, arranging one or multiple of sheets of low density pyrolytic graphite to the indent, compressing the one or multiple of sheets of low density pyrolytic graphite with the copper insert, and attaching the copper insert to the heatsink with the one or multiple of sheets of low density pyrolytic graphite in compressed state between the copper insert and the heatsink.

20. An electronic device, comprising:

at least one heat generating semiconductor component; and a heatsink assembly, the heatsink assembly comprising a heatsink, a copper insert, and a layer of low density pyrolytic graphite having a density in a range of 0.25 $g/cm^3$ to 1.8 $g/cm^3$, wherein the copper insert and the layer of low density pyrolytic graphite are arranged on a surface of the heatsink in layers to form a heat transferring assembly, and wherein the at least one heat generating semiconductor component is attached to the heat transferring assembly to transfer heat from the at least one heat generating semiconductor component to the heatsink.

* * * * *